United States Patent
LaGarde

[11] Patent Number: 5,901,181
[45] Date of Patent: May 4, 1999

[54] CIRCUIT FOR RESTORING BITS TRANSMITTED BY A SERIES SIGNAL

[75] Inventor: Jean-Pierre LaGarde, Saint Martin Le Vinoux, France

[73] Assignee: SGS-Thomson Microelectronics S.A., Saint Genis, France

[21] Appl. No.: 08/571,617

[22] Filed: Dec. 13, 1995

[30] Foreign Application Priority Data

Dec. 30, 1994 [FR] France ..................... 94-16012

[51] Int. Cl.$^6$ .............. H04L 25/06; H04L 25/10
[52] U.S. Cl. .................. 375/317; 375/371; 375/375
[58] Field of Search ..................... 375/317, 371, 375/375, 376, 355; 327/2, 7, 9, 23, 24, 26

[56] References Cited

U.S. PATENT DOCUMENTS

| | | | |
|---|---|---|---|
| 4,418,406 | 11/1983 | Ogawa | 369/124 |
| 5,105,447 | 4/1992 | Iwane | 375/360 |
| 5,233,930 | 8/1993 | Zato | 358/147 |

FOREIGN PATENT DOCUMENTS

A-0 531 549  3/1993  European Pat. Off. ......... H04N 7/08

OTHER PUBLICATIONS

French Search Report from French Patent Application 94 16012, filed Dec. 30, 1994.

*Primary Examiner*—Don N. Vo
*Attorney, Agent, or Firm*—Wolf, Greenfield & Sacks, P.C.

[57] ABSTRACT

The present invention relates to a circuit for restoring bits transmitted by an asynchronous signal, including a comparator of the signal level with a discrimination threshold; a sampling circuit taking several samples from the comparator output for each time interval corresponding to a bit; a circuit for generating an analysis signal at a frequency substantially equal to the bit transmission speed; and an analysis circuit to correct the discrimination threshold according to the difference between two phase values corresponding to the phase relationships with respect to the analysis signal of two consecutive sample transitions, and/or correct the phase of the analysis signal with respect to the bit transmission depending on the sum of the two said phase values.

31 Claims, 3 Drawing Sheets

CIRCUIT FOR RESTORING BITS TRANSMITTED BY A SERIES SIGNAL

BACKGROUND OF THE INVENTION

1. Field of the Invention

The present invention relates to a circuit for restoring logic levels of bits transmitted asynchronously and serially in a signal. The present invention relates more particularly to a circuit that properly restores bits even when a transmission signal undergoes phase and amplitude variations.

2. Discussion of the Related Art

FIG. 1 shows an example of a transmission signal 9. The transmission signal 9 is used to transmit teletext information 11. Each line of teletext information begins with a synchronization burst 10.

Depending on the conditions at a receiving circuit, a teletext signal may include noise, and be of variable amplitude and phase. However, using the synchronization burst 10 at the beginning of each line of teletext information 11, the circuit receiving the transmission signal 9 can periodically readjust its receive phase and a discrimination threshold used to distinguish the high logic levels from the low logic levels in the lines of teletext information.

U.S. Pat. No. 5,136,382 describes a circuit for receiving lines of teletext information included in a transmission signal. The frequency and the discrimination threshold found at the beginning of each line are maintained for the entire duration of the line, until the next synchronization pulse burst. Thus, the circuit does not compensate for possible amplitude and phase fluctuations in a line of the teletext information, which could result in many errors if the conditions at the receiving circuit are not optimal.

SUMMARY OF THE INVENTION

An object of the present invention is to provide a circuit enabling a continuous compensation of amplitude and phase fluctuations of an asynchronous bit transmission signal, the initial transmission frequency and the discrimination threshold being either fixed or periodically determined, as in the case of teletext transmission signals, by means of synchronization bursts.

This object is achieved by means of a circuit for restoring bits transmitted by an asynchronous signal, including a comparator of the signal level with a discrimination threshold; a sampling circuit taking several samples from the output of the comparator for each time interval corresponding to a bit; a circuit for generating an analysis signal at a frequency substantially equal to the bit transmission speed; and an analysis circuit for correcting the discrimination threshold according to the difference between two phase signals respectively indicative of two phase values corresponding to the phase relationships with respect to the analysis signal of two consecutive transitions of the samples, and/or correct the phase of the analysis signal with respect to the bit transmission according to the sum of the two phase values.

According to an embodiment of the present invention, each phase value corresponds to the number of samples at a same value separating the corresponding transition from the nearest border of the current period of the analysis signal, the number being positive or negative according to whether the nearest border is the beginning or the end of the period.

According to an embodiment of the present invention, the discrimination threshold is increased if said difference has a first sign and a downward first transition or if the difference has a second sign and an upward first transition, and, otherwise, is diminished.

According to an embodiment of the present invention, the circuit includes first and second counters respectively associated with the difference and sum, at the rate of the frequency of the sampling circuit, and enabled in an up-counting or down-counting mode according to the state of a sample taken at the beginning of a period of the analysis signal, to the analyzed bit state, and to the analysis signal.

According to an embodiment of the present invention, the mode of the first counter is selected by the state of the sample taken at the beginning of the analysis period, and the mode of the second counter is selected by the state of the analysis signal.

According to an embodiment of the present invention, the counters are enabled by the output of an exclusive-OR gate receiving the state of the sample taken at the beginning of the period of the analysis signal and the state of the analyzed bit.

The foregoing and other objects, features and advantages of the present invention will be more readily understood and apparent from the following detailed description of illustrative embodiments according to the invention which should be read in conjunction with the accompanying drawings, but not limited by them.

DETAILED DESCRIPTION

Figure 1:
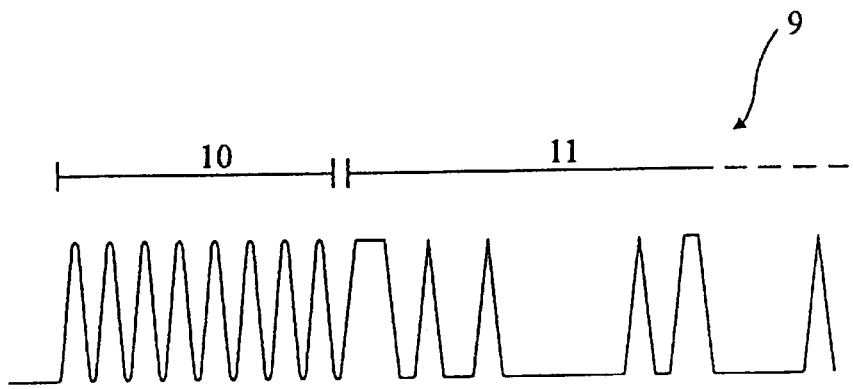
FIG. 1 shows an example of a bit transmission signal, beginning with a synchronization burst.
Figure 2:
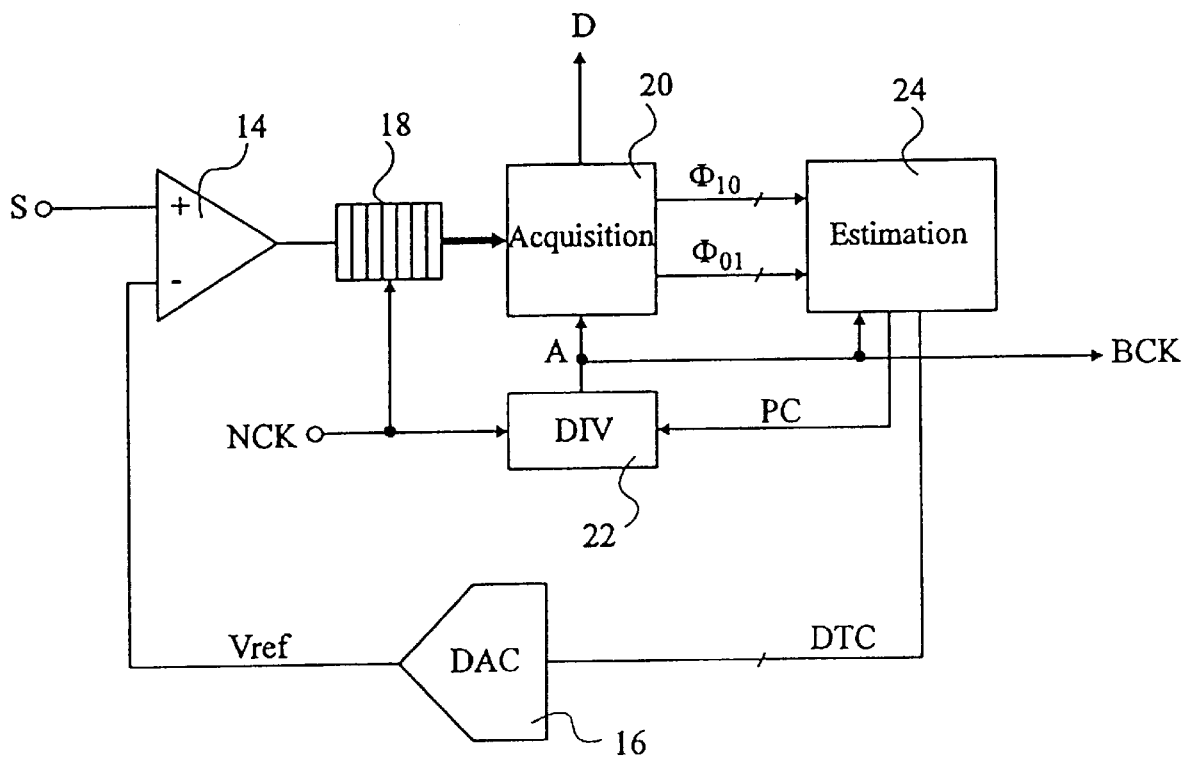
FIG. 2 schematically shows an embodiment of a circuit for restoring bits according to the present invention.

In FIG. 2, an asynchronous bit transmission signal S is received at a non-inverter input of a comparator 14. An inverter input of the comparator 14 receives a reference voltage Vref supplied by a digital-to-analog converter 16. Converter 16 supplies an adjustable discrimination threshold corresponding to the voltage Vref.

The output of comparator 14 is supplied to an N bit (e.g., 7 bits) shift register 18. This shift register is enabled by a signal NCK with a frequency N times higher than the nominal bit transmission speed. Thus, at the end of the transmission of each bit, shift register 18 contains N (e.g., seven) samples of the bit.

An acquisition circuit 20 analyzes the contents of shift register 18 in successive periods of a synchronization or analysis signal A having a frequency ideally equal to the bit transmission speed. The synchronization signal A is supplied by a divider 22 which receives the sampling signal NCK and, in nominal conditions, divides the frequency of sampling signal NCK signal by N (e.g., 7).

Acquisition circuit 20 establishes, based on the contents of shift register 18, a first signal and a second signal respectively indicative of a phase value $\phi 10$ and a phase value $\phi 01$. Value $\phi 10$ indicates the phase relationship between synchronization signal A and a downward transition of the samples of shift register 18. Value $\phi 01$ indicates the phase relationship between the synchronization signal A and an upward transition of the samples of shift register 18. In nominal conditions, the transitions coincide with beginnings of the synchronization signal periods, all the samples of shift register 18 are at the same value in each analysis period, and values φ10 and φ01 indicated by the first and second signals are equal to zero.

In a given analysis period, if a transition is in the first half of the shift register (i.e., it occurred shortly after the beginning of the analysis period), the corresponding value φ10 indicated by the first signal (downward transition) or φ01 indicated by the second signal (upward transition) is a positive number equal, for instance, to the number of samples with the same value preceding the transition. If the transition is in the second half of shift register 18 (i.e., it occurred shortly before the end of the analysis period), the corresponding value φ10 or φ01 is a negative number with an absolute value equal, for instance, to the number of samples at the same value preceding the transition.

Acquisition circuit 20 also supplies a bit signal indicative of a value D of the bit corresponding to the contents of shift register 18. This value D is, for instance, the majority value of the samples, or alternatively the median value (i.e., the value of the central sample of the shift register). It is possible to draw from the output of the divider 22, which provides the synchronization signal A, a second synchronization signal BCK of the bits supplied on the output of the acquisition circuit 20 supplying the bit signal indicative of the value D.

The first and second signals indicative of the phase values φ10 and φ01 are supplied to an estimation circuit 24. This estimation circuit 24 determines, for each pair of successive non-zero phase values (φ10, φ01), a phase correcting signal PC indicative of a phase correcting value which is used to modify the division rate of divider 22, and a discrimination threshold correcting signal DTC indicative of a correcting value of discrimination threshold Vref which is used to modify the value Vref supplied to converter 16.

In order to obtain a variable division rate, divider 22 is, for example, a counter to N, with its incrementation by signal NCK being inhibited during one or more cycles to increase its division rate, or accelerated by providing one or more additional incrementation pulses to decrease its division rate. The value Vref supplied to converter 16 corresponds to, for instance, the content of a counter which is incremented or decremented in order to modify threshold Vref.

Figure 3A:
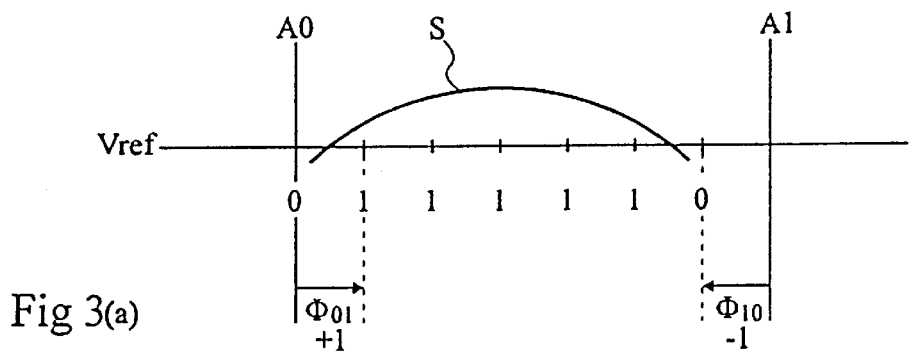
FIGS. 3(a)–3(c) shows various cases of analysis, according to the present invention, of a transmission signal.
Figure 3B:
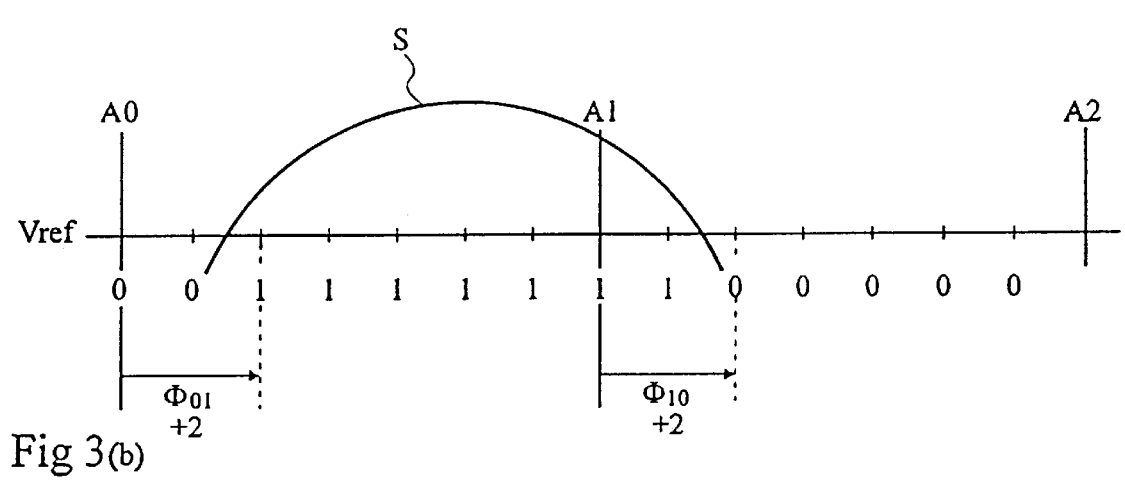
Figure 3C:
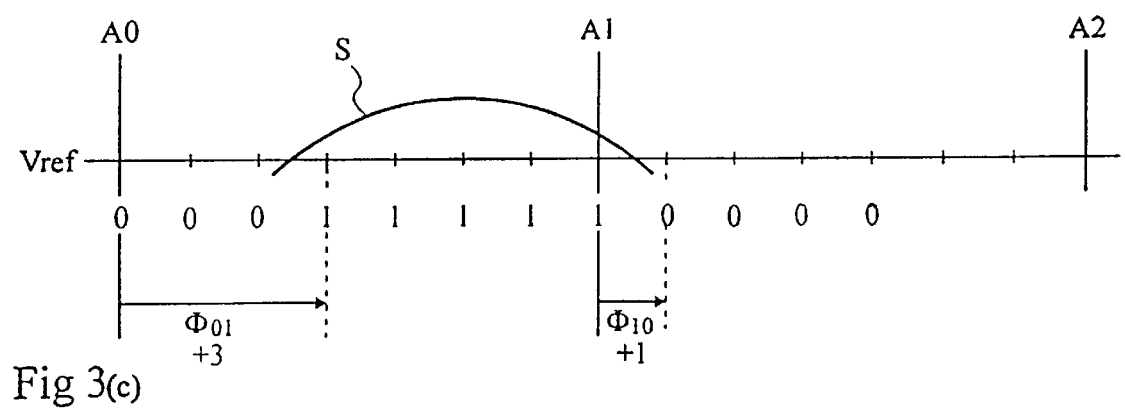

FIGS. 3(a)–(b) are meant to illustrate how estimating circuit 24 interprets, according to the invention, various examples of typical cases, numbered from FIG. 3(a) to FIG. 3(c), of evolution of the asynchronous transmission signal S to be processed. In this example, it is assumed that seven samples per bit are taken. Beginnings of successive analysis periods A0, A1, A2, are indicated by vertical bars and the values of the samples are indicated under the portion of signal S which is graphically shown.

In FIG. 3(a), discrimination threshold Vref is too high but synchronization signal A is in phase with the bit succession. Signal S goes over threshold Vref between the first and second samples after time A0, then crosses threshold Vref again between the sixth and seventh samples. The first and seventh samples are at 0 and the other samples are at 1. Value φ01 is equal to +1 and value φ10 to −1.

A negative φ10−φ01 difference indicates that threshold Vref is too high. A φ10+φ01 sum equal to zero indicates that the synchronization signal A is in phase with the bit succession. As soon as estimation circuit 24 detects this case, that is, shortly after time A1, the value supplied to digital-to-analog converter 16 is decreased, for example, by modifying it proportionally to difference φ10−φ01.

In the complementary case, that is, when discrimination threshold Vref is too low, signal S begins by passing below threshold Vref shortly after time A0, and crosses threshold Vref again shortly before time A1. In this case, values φ10 and φ01 have signs opposite to those of FIG. 3(a) and difference φ10−φ01 is positive. Then, threshold Vref is increased.

In FIG. 3(b), threshold Vref is at the optimal value, but the synchronization signal A has a phase advance over the bit succession. Signal S goes over threshold Vref between the second and third samples after time A0, then crosses threshold Vref again between the second and third samples after time A1. Value φ01, equal to +2, found at time A1 is stored, and value φ10, in the acquisition circuit 20 also equal to +2, is found at time A2.

The difference φ10−φ01 equal to zero indicates that threshold Vref is at the optimal value. The sum φ10+φ01 being positive indicates that the analysis period is in phase advance relative to the bit succession. This case is detected at time A2 when the estimation circuit has the two values φ10 and φ01. The correction is performed by increasing the division rate of divider 22. The division rate is, for example, increased by half sum φ10+φ01. Then, in the current example, the division rate passes from 7 to 9, which results in delaying the next analysis period beginning (A3) by two samples and canceling the phase advance which was precisely of two samples.

The complementary case, that is, the phase delay of the synchronization signal A with respect to the bit succession is detected when sum φ10+φ01 is negative. Then, the division rate of divider 22 is decreased, which results in advancing the beginning of the next analysis period. If the division rate passes, for instance, from 7 to 5, this next analysis period beginning occurs with an advance of two samples.

FIG. 3(c) corresponds to the combination of cases FIGS. 3(a) and 3(b), that is, the synchronization signal A has a phase advance over the bit succession and threshold Vref is too high. Values φ10 and φ01 are respectively equal to +1 and +3. This case is also detected according to the rules described in relation with cases (a) and (b). In particular, the difference φ10−φ01 being negative indicates that the threshold Vref is too high. Additionally, the sum φ10+φ01 being positive indicates that the analysis period is too advanced relative to the bit succession. The corrections brought by the estimation circuit are those mentioned in connection to cases (a) and (b).

The phase and threshold corrections can be applied as soon as the corresponding cases are detected, or alternatively only if these cases occur repeatedly. By applying the latter correction method, erroneous corrections that would be caused by parasitic dephasings are avoided. In order to do this, for example, the successive differences φ10−φ01 and sums φ10+φ01 are added and the corresponding corrections are applied only if the addition exceeds a predetermined threshold.

Figure 4:
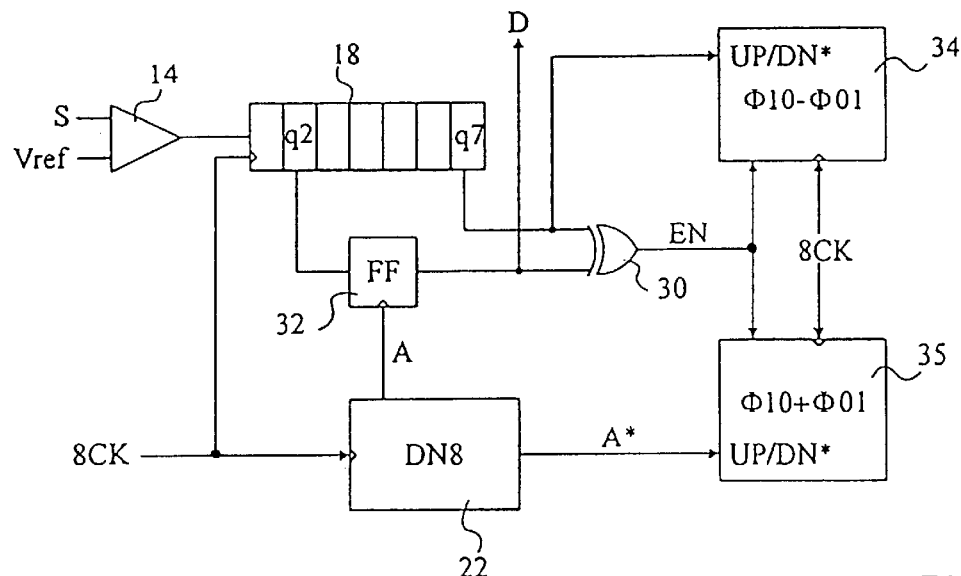
FIG. 4 partially shows a detailed example of a circuit for restoring bits according to the present invention.

FIG. 4 partially shows a detailed example of a circuit according to an embodiment of the invention, performing a series analysis of the bits of shift register 18. This circuit functions with eight samples per bit. Shift register 18, enabled at a frequency 8CK, is of seven bits, among which the second one, q2, and the seventh, q7, are provided on outputs. Divider 22, which divides frequency 8CK by 8, supplies complementary synchronization signals A and A*. Bit q7 is directly supplied to a first input of an exclusive-OR gate 30, and bit q2 is supplied to a flip-flop 32 enabled by signal A. The output of flip-flop 32 supplies a bit signal indicative of a value D of the bit analyzed and is connected to a second input of gate 30. The output of gate 30 supplies an enable signal EN to two up/down counters 34 and 35 which are rated at frequency 8CK. Up/down counter 34 is associated with difference $\phi10-\phi01$ and its counting direction is determined by bit q7. Up/down counter 35 is associated with sum $\phi10+\phi01$ and its counting direction is determined by signal A*.

Figure 5:
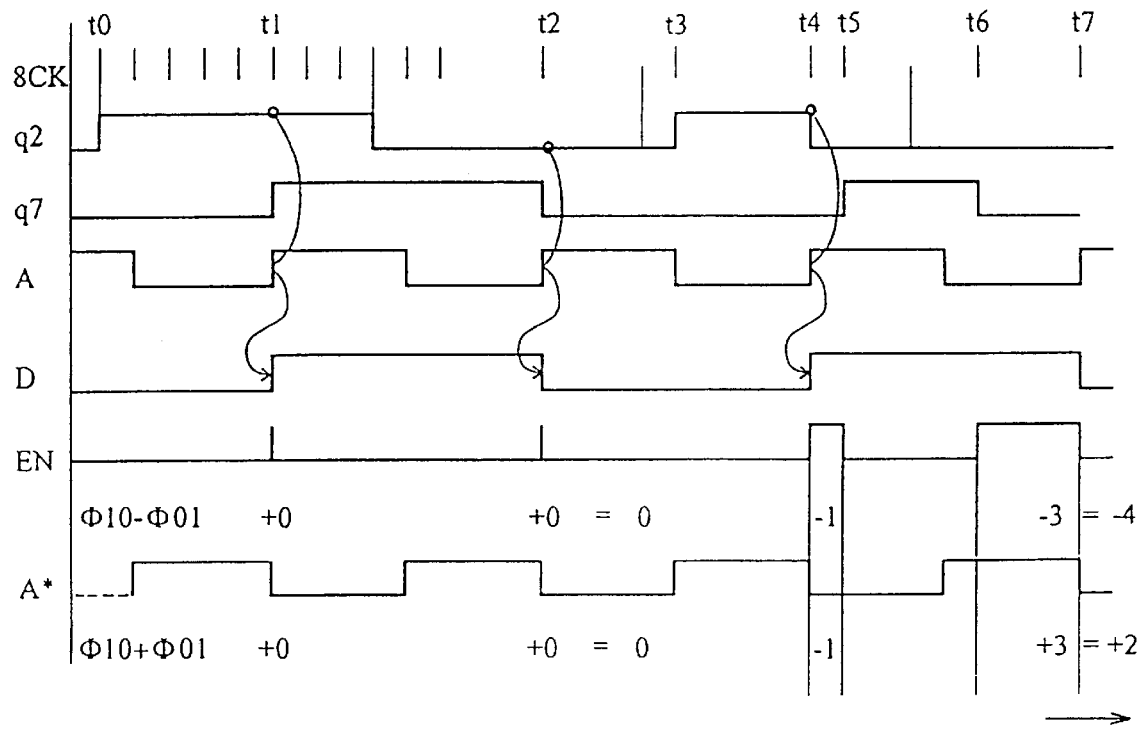
FIG. 5 shows a timing diagram illustrating the operation of the circuit of FIG. 4.

FIG. 5 shows a timing diagram illustrating the operation of the circuit of FIG. 4 for an example where bits 1, 0, 1 and 0 are transmitted. The first two bits 1 and 0 are transmitted in ideal conditions and the third bit, 1, is transmitted with too high a threshold Vref and with a phase delay. The complementary analysis signals A and A* have a cyclic ratio of 50%.

At time t0, bit q2 switches to 1 and remains at 1 for 8 clock cycles 8CK.

At time t1, five cycles 8CK after time t0, bit q7 switches to 1 and remains at 1 for eight clock cycles 8CK. Synchronization signal A also switches to 1, which causes the storage of the 1 state of bit q2 in flip-flop 32 (i.e., signal D switches to 1).

At time t2, bit q7 switches to 0 and signal A switches to 1 again. Signal D takes the 0 state of bit q2.

At time t3, bit q2 switches to 1 again, but with a delay of one cycle 8CK, and remains at 1 for four cycles 8CK rather than eight.

Bit q2 switches to 0 at time t4, while signal A switches to 1. Signal D has time to take the 1 state of bit q2. Signal D remains at 1 until the next rising edge of signal A. Signals q7 and D are at different values and signal EN (the output of gate 30) switches to 1. Up to time t4, signal D was in phase with the evolution of bit q7, which meant that the situation was ideal, indicated by signal EN being at 0.

At time t5, bit q7 switches to 1, following the evolution of bit q2 with a delay of five cycles 8CK. Signals q7 and D are at the same value and signal EN switches to 0. Counter 34 has just been enabled during a cycle 8CK in the down counting mode (selected by bit q7 being at 0). Its contents ($\phi10-\phi01$) are thus decreased by 1. Signal EN has also enabled, during a cycle 8CK, counter 35 which was in the down counting mode (signal A* at 0). Its contents ($\phi10+\phi01$) are thus decreased by 1. The modification of the counter contents are illustrated by signed numbers in FIG. 5.

At time t6, bit q7 switches to 0, while signal D still is at 1. Signal EN switches to 1 again and remains at 1 until time t7 when signal D takes the 0 value of bit q2 at the rising edge of signal A. Signal EN remains at 1 during three cycles 8CK. Counter 34 is decremented by 3 (i.e., its down counting mode is selected by bit q7 being at 0) while counter 35 is incremented by 3 (i.e., its counting mode is selected by signal A* being at 1).

At time t7, contents $\phi10-\phi01$ of counter 34 have decreased by 4 indicating that threshold Vref is too high. Contents $\phi10+\phi01$ of counter 35 have increased by 2 indicating a phase advance of signal A.

As previously noted, in one embodiment, the corrections are performed if the conditions which cause them occur repeatedly. For this purpose, a modification of threshold Vref is performed each time counter 34 overflows and a modification of the phase (of the division rate of divider 22) is performed each time counter 35 overflows. The modifications are performed according to the overflow direction of the counters. A modification is performed only for every two sample transitions, otherwise values $\phi10-\phi01$ and $\phi10+\phi01$ would have no meaning. In this manner, limiting cases are properly taken into account, such as a counter which consecutively undergoes two overflows in opposite directions, which results in no correction.

In the example of FIGS. 4 and 5, a shift register 18 of seven bits, the second and the seventh of which are being used, is described. With this configuration, the portions at 1 of the synchronization signal A are centered, in the nominal case, on the transitions of signal S to be analyzed. Any other configuration is possible, provided two shift register bits are used which evolve with a predetermined difference, such as five sampling cycles in the example where each bit is sampled eight times. By choosing another configuration, the nominal phase of signal A is merely shifted with respect to the transitions of signal S.

The circuit according to the invention applies to any asynchronous transmission signal of bits with a transmission frequency and an amplitude having known nominal values.

Of course, the circuit according to the invention also applies to teletext signals which periodically include synchronization bursts. In this case, the circuit uses the synchronization bursts to enable the phase and the discrimination threshold obtained up to then. During a synchronization burst, the phase and discrimination threshold adjustments are performed, for example, as described in the above-mentioned U.S. Pat. No. 5,136,382.

Having thus described at least one illustrative embodiment of the invention, various alterations, modifications, and improvements will readily occur to those skilled in the art. Such alterations, modifications, and improvements are intended to be within the spirit and the scope of the invention. Accordingly, the foregoing description is by way of example only and is not intended as limiting. The invention is limited only as defined in the following claims and the equivalents thereto.

What is claimed is:

1. A circuit for restoring bits transmitted by an asynchronous signal, comprising:

a comparator that compares a level of the asynchronous signal with a discrimination threshold, the comparator having an output that provides a comparator output signal;

a sampling circuit that provides several samples from the comparator output signal for each time interval corresponding to a bit;

a generating circuit that generates an analysis signal having a frequency substantially equal to a bit transmission speed of the bit; and an analysis circuit for providing a first phase signal associated with a first transition of the asynchronous signal and a second phase signal associated with a second consecutive transition of the asynchronous signal wherein the analysis circuit corrects a phase of the analysis signal with respect to the bit transmission speed according to a sum of a first phase value associated with the first phase signal and a second phase value associated with the second phase signal.

2. The restoring circuit of claim 1, wherein the phase value of each phase signal corresponds to the number of samples at a same value separating the associated transition of the asynchronous signal from a nearest border of a current period of the analysis signal, the number being positive when the nearest border is at the beginning of the consecutive period, and negative when the nearest border is at the end of the current period.

3. The restoring circuit of claim 1, wherein a duration of a next period of the analysis signal is modified by a value related to the sum.

4. The restoring circuit of claim 1, including a first counter and a second counter respectively associated with the difference and the sum, the first and the second counters operating at a rate of a frequency of the sampling circuit, and being enabled in one of an up-counting mode and a down-counting mode according to a state of a sample at a beginning of a period of the analysis signal, an analyzed bit state, and the analysis signal.

5. The restoring circuit of claim 4, wherein the mode of the first counter is selected by the state of the sample taken at the beginning of the period of the analysis signal, and the mode of the second counter is selected by a state of the analysis signal.

6. The restoring circuit of claim 5, wherein each of the first and second counters is enabled by the output of an exclusive-OR gate receiving the state of the sample at the beginning of the period of the analysis signal and the analyzed bit state.

7. A method for processing a transmission signal, the method comprising the steps of:

deriving a plurality of sets of signal samples from the transmission signal in accordance with a control signal;

deriving a sum signal indicative of a sum of a first duration of time between a first transition of the transmission signal and the beginning of one of the sets and a second duration of time between a second transition of the transmission signal and the end of that set;

deriving a difference signal indicative of a difference between the first duration of time and the second duration of time; and adjusting the control signal according to the sum and difference signals.

8. The method of claim 7, wherein the control signal is an analysis signal that defines a time period; and wherein the step of adjusting includes the step of changing a length of the time period defined by the analysis signal to modify the number of signal samples in a set of signal samples.

9. The method of claim 8, wherein the step of deriving the plurality of sets includes the step of:

generating a comparison signal from a comparison of the transmission signal with a reference signal; and sampling the comparison signal at regular intervals within the time period defined by the analysis signal.

10. The method of claim 7, wherein the control signal is a reference signal having a reference level, wherein the step of deriving the plurality of sets includes deriving the plurality of sets of signal samples from the transmission signal in accordance with the reference signal, and wherein the step of adjusting includes the step of changing the reference level of the reference signal according to the sum and difference signals.

11. The method of claim 10, wherein the step of deriving the plurality of sets further includes the step of deriving the plurality of sets of signal samples from an analysis signal that defines a time period; and wherein the method further comprises the step of changing a length of the time period defined by the analysis signal to modify the number of signal samples in a set of signal samples.

12. The method of claim 7, further comprising the step of generating a data bit for each set of signal samples.

13. An apparatus for processing a transmission signal, the apparatus comprising:

a sampling circuit that derives a plurality of sets of signal samples from the transmission signal in accordance with a control signal;

a determining circuit that derives a sum signal indicative of a sum of a first duration of time between a first transition of the transmission signal and the beginning of one of the sets and a second duration of time between a second transition of the transmission signal and the end of that set, and derives a difference signal indicative of a difference between the first duration of time and the second duration of time; and means for adjusting the control signal according to the sum and difference signals.

14. The apparatus of claim 13, wherein the control signal is an analysis signal that defines a time period; and wherein the means for adjusting includes means for changing a length of the time period defined by the analysis signal to modify the number of signal samples in a set of signal samples.

15. The apparatus of claim 14, wherein the sampling circuit includes:

a comparator that receives the transmission signal with a reference signal, and provides a comparison signal; and a storage device that samples the comparison signal at regular intervals within the time period defined by the analysis signal.

16. The apparatus of claim 13, wherein the control signal is a reference signal having a reference level, wherein the sampling circuit derives the plurality of sets of signal samples from the transmission signal in accordance with the reference signal, and wherein the means for adjusting includes means for changing the reference level of the reference signal according to the sum and difference signals.

17. The apparatus of claim 16, wherein sampling circuit derives the plurality of sets of signal samples from the transmission signal in accordance with an analysis signal that defines a time period; and wherein the apparatus further comprises means for changing a length of the time period defined by the analysis signal to modify the number of signal samples in a set of signal samples.

18. The apparatus of claim 13, further comprising a generating circuit that generates a data bit for each set of signal samples.

19. An apparatus for processing a transmission signal, the apparatus comprising:

a sampling circuit having a first input that receives the transmission signal, a second input that receives a control signal, and an output that provides a plurality of sets of signal samples;

a determining circuit having a first input coupled to the output of the sampling circuit, and an output bus that respectively provides a sum signal indicative of a sum of a first duration of time between a first transition of the transmission signal and the beginning of one of the sets and a second duration of time between a second transition of the transmission signal and the end of that set, and a difference signal indicative of a difference between the first duration of time and the second duration of time; and an adjusting circuit having an input bus coupled to the output bus of the determining circuit, and an output coupled to the second input of the sampling circuit.

20. The apparatus of claim 19, wherein the control signal is an analysis signal that defines a time period; and wherein the adjusting circuit includes a divider having an output coupled to the third input of the sampling circuit, the output of the divider being the output of the adjusting circuit.

21. The apparatus of claim 20, wherein the sampling circuit includes:

a comparator having a first input as the first input of the sampling circuit, a second input that receives a reference signal having a reference level, and an output that provides a comparison signal; and a storage device having a first input coupled to the output of the comparator, a second input as the second input of the sampling circuit that receives the analysis signal, and an output that provides the signal samples.

22. The apparatus of claim 19, wherein the control signal is a reference signal having a reference level, wherein the sampling circuit derives the plurality of sets of signal samples from the transmission signal in accordance with the reference signal, and wherein the adjusting circuit includes circuitry that changes the reference level of the reference signal according to the sum and difference signals.

23. The apparatus of claim 22, wherein the sampling circuit further includes a third input that receives an analysis signal that defines a time period; and wherein the apparatus further comprises a divider having an output coupled to the third input of the sampling circuit that provides the analysis signal.

24. The apparatus of claim 19, further comprising circuitry that generates a data bit for each set of signal samples.

25. A circuit for restoring bits transmitted by an asynchronous signal, comprising:

a comparator that compares a level of the asynchronous signal with a discrimination threshold, the comparator having an output that provides a comparator output signal;

a sampling circuit that provides several samples from the comparator output signal for each time interval corresponding to a bit;

a generating circuit that generates an analysis signal having a frequency substantially equal to a bit transmission speed of the bit; and an analysis circuit that corrects the discrimination threshold according to a difference between a first phase value and of a first phase signal associated with a first transition of the asynchronous signal and a second phase value of a second phase signal associated with a second, consecutive transition of the asynchronous signal.

26. The restoring circuit of claim 25, wherein the phase value of each phase signal corresponds to the number of samples at a same value separating the associated transition of the asynchronous signal from a nearest border of a current period of the analysis signal, the number being positive when the nearest border is at the beginning of the current period, and negative when the nearest border is at the end of the current period.

27. The restoring circuit of claim 25, wherein a next period of the analysis signal is one of lengthened and shortened according to the sum.

28. The restoring circuit of claim 25, wherein the discrimination threshold is increased if the difference is a positive number and the first transition is downward, and if the difference is a negative number and the first transition is upward, and otherwise decreased.

29. The restoring circuit of claim 25, including a first counter and a second counter respectively associated with the difference and the sum, the first and the second counters operating at a rate of a frequency of the sampling circuit, and being enabled in one of an up-counting mode and a down-counting mode according to a state of a sample at a beginning of a period of the analysis signal, an analyzed bit state, and the analysis signal.

30. The restoring circuit of claim 29, wherein the mode of the first counter is selected by the state of the sample taken at the beginning of the period of the analysis signal, and the mode of the second counter is selected by a state of the analysis signal.

31. The restoring circuit of claim 30, wherein each of the first and second counters is enabled by the output of an exclusive-OR gate receiving the state of the sample at the beginning of the period of the analysis signal and the analyzed bit state.

* * * * *